(12) United States Patent
Narita

(10) Patent No.: US 9,252,726 B2
(45) Date of Patent: Feb. 2, 2016

(54) DUAL PATH OPERATIONAL AMPLIFIER

(71) Applicant: Takashi Narita, Tokyo (JP)

(72) Inventor: Takashi Narita, Tokyo (JP)

(*) Notice: Subject to any disclaimer, the term of this patent is extended or adjusted under 35 U.S.C. 154(b) by 30 days.

(21) Appl. No.: 14/191,847

(22) Filed: Feb. 27, 2014

(65) Prior Publication Data
US 2014/0240044 A1    Aug. 28, 2014

Related U.S. Application Data

(60) Provisional application No. 61/770,014, filed on Feb. 27, 2013.

(51) Int. Cl.
| | |
|---|---|
| *H03F 3/68* | (2006.01) |
| *H03F 3/45* | (2006.01) |
| *H03F 1/34* | (2006.01) |
| *H03F 1/22* | (2006.01) |
| *H03F 1/14* | (2006.01) |

(52) U.S. Cl.
CPC .............. *H03F 3/45632* (2013.01); *H03F 1/14* (2013.01); *H03F 1/223* (2013.01); *H03F 1/342* (2013.01); *H03F 3/45183* (2013.01); *H03F 3/45192* (2013.01); *H03F 3/68* (2013.01); *H03F 2203/45311* (2013.01); *H03F 2203/45476* (2013.01); *H03F 2203/45478* (2013.01); *H03F 2203/45512* (2013.01); *H03F 2203/45528* (2013.01); *H03F 2203/45631* (2013.01); *H03F 2203/45674* (2013.01); *H03F 2203/45701* (2013.01)

(58) Field of Classification Search
USPC .................................................. 330/252–261
See application file for complete search history.

(56) References Cited

U.S. PATENT DOCUMENTS 7,161,420 B1 *  1/2007  Aram et al. ........................ 330/9

* cited by examiner

*Primary Examiner* — Hieu Nguyen

(57) ABSTRACT

An operational amplifier has two paths, a high frequency path and a low frequency path. In addition, it has three main sections of stages. A stage converts input voltage to an amplified output voltage, a stage converting an input voltage in to an output current and a final stage where the outputs of the two previous sections are supplied as inputs. Among them, the final stage acts as a voltage follower to a signal applied to its plus (+) input and as a transimpedance amplifier for a signal applied to its minus input (−). In this configuration, a path for low frequencies and a path for high frequencies are created in a single operational amplifier.

17 Claims, 6 Drawing Sheets

DUAL PATH OPERATIONAL AMPLIFIER

The current application claims a priority to the U.S. Provisional Patent Application Ser. No. 61/770,045, filed on Feb. 27, 2013.

FIELD OF INVENTION

The present invention relates to operational amplifiers. More specifically, the present invention is a dual path operational amplifier with a high frequency path and a low frequency path.

BACKGROUND OF THE INVENTION

Operational amplifiers (Op-amps) are among the most widely used electronic devices today. It has a variety of functions and is used in many industries. In designing Op-amp, sizes of transistors in differential input stage have to be large in order to obtain good DC characteristics. As a result, frequency poles relating to parasitic capacitances of the transistors are formed at lower frequency. These lower poles impose limitation on bandwidth of the Op-amp. Therefore in designing high speed Op-amp, adding one more signal path in which there are no large transistors can be effective way. The present invention provides one method to design dual-path operational amplifier which is able to drive not only captive load but also resistive load.

DETAILED DESCRIPTION OF THE INVENTION

Figure 1:
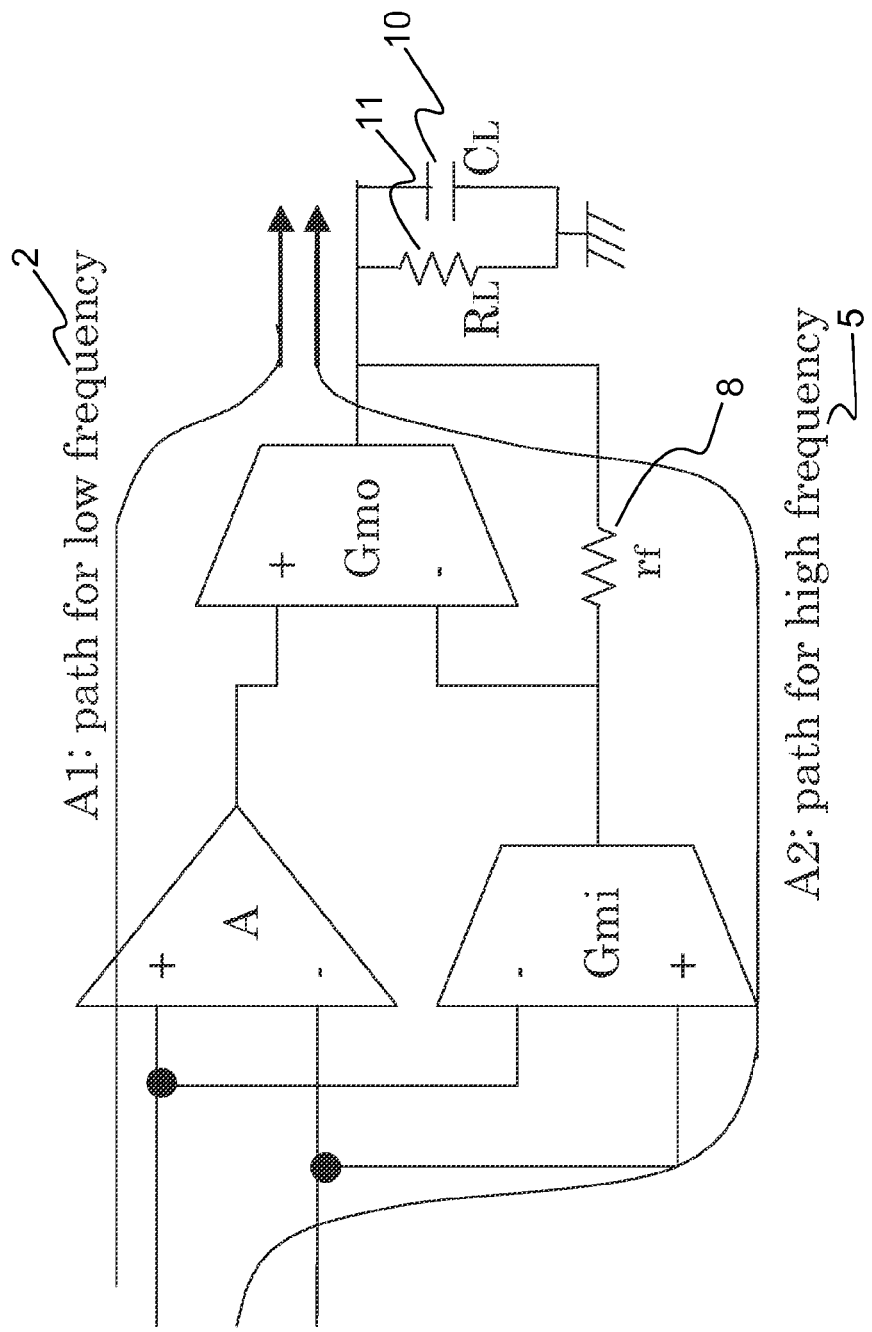
FIG. 1 is a diagram representing a block diagram of an operational amplifier comprising a low frequency path and a high frequency path.

All illustrations of the drawings and description of embodiments are for the purpose of describing selected versions of the present invention and are not intended to limit the scope of the present invention.

The present invention comprises of three main sections. The first section, 2 converts an input voltage into an amplified output voltage. The second main section, 5 converts input voltage into an output current. This current is sent through a resistor, rf 8, to get the required voltage corresponding to this section 5. The final section, 9 comprises an operational amplifier in which the output of the first stage 2 is the input at the plus (+) port and the output of the second stage 5 is the input at the minus (−) port.

In the final section 9, for a signal connected to the plus (+) input, the amplifier acts as a voltage follower. A voltage follower is a system where the output voltage follows the input voltage.

On the other hand, for an input signal applied to the minus (−) input, the amplifier acts as a Transimpedance Amplifier (TIA). Where a TIA is a current to voltage converter, usually implemented using an operational amplifier. As a result of this setup, the path connected to the plus input carries low frequencies 2 and the path connected to the minus input carries higher frequencies 5. The path for low frequencies 2 has a high DC (Direct Current) gain and the path for high frequencies 5, has a low DC gain.

Furthermore, in reference to FIG. 1, this illustrates a block diagram of the present invention. In the preferred embodiment of the present invention, the above mentioned first stage 2 amplifying the input voltage is referred to as stage A, stage converting voltage into current 5 is referred to as Gmi and the final stage 9 receiving the outputs of the previous sections is identified as Gmo. Therefore we see that the low frequency path comprises of stages A and Gmo while the high frequency path comprises stages Gmi and Gmo. In addition to the above mentioned sections, this diagram also shows additional components such as the resistor ($r_f$) 8 connected to Gmi and load resistor ($R_L$) 11 and load capacitor ($C_L$) 10 connected in parallel.

Figure 2:
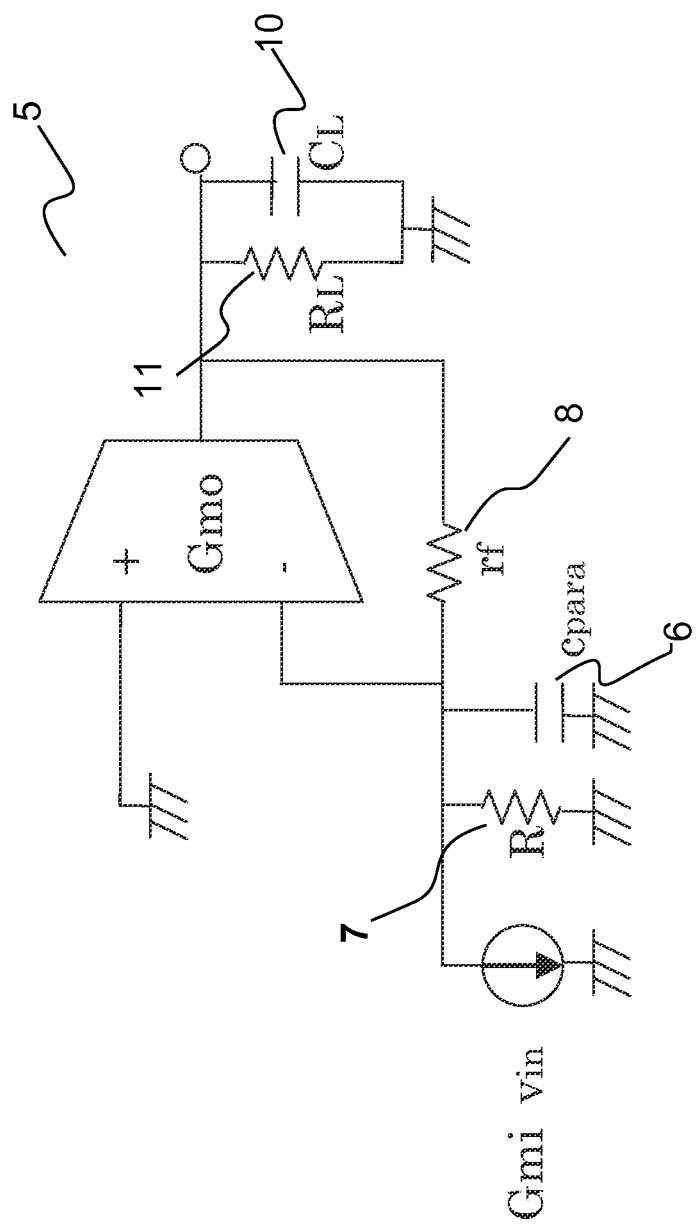
FIG. 2 is an equivalent circuit for the path carrying high frequencies of the present invention.

In reference to FIG. 2, this is an equivalent circuit for the path carrying high frequencies 5. In the preferred embodiment of the present invention, this is referred to as path A2 5. In this case the final stage 9, Gmo, acts as a TIA. The diagram also shows the earlier mentioned load resistor-load capacitor parallel connection, parasitic capacitor 6 ($c_{para}$), resistor rf 8 and output resistance of Gmi (R) 7 connected in parallel to the parasitic capacitor 6. The transfer function of the path A2 5 is given by the following equation:

$$[V_{out}/V_{in}]=[Gmi \cdot R \cdot R_L(Gmo \cdot rf-1)]/\{Gmo \cdot R \cdot R_L+R+R_L+rf+s \cdot [C_L \cdot R_L \cdot (R+rf)+c_{para} \cdot R \cdot (R_L+rf)]+s^2 \cdot c_{para} \cdot C_L \cdot R \cdot R_L \cdot rf\} \approx Gmi \cdot R_L(Gmo \cdot rf-1)/[(Gmo \cdot R_L+1) \cdot \{1+s \cdot C_L \cdot R_L/(Gmo \cdot R_L+1)\}\{1+s \cdot c_{para} \cdot rf\}]$$

In this calculation it was assumed that:
[rf·(Gmo+1/RL)·cpara]/$C_L$≪1
Vout—Output voltage
Vin—Input voltage
R—Output resistance of Gmi
$c_{para}$—parasitic capacitance value
$C_L$—Load capacitor for the op-amp
$R_L$—Load resistor for the op-amp From the above obtained expression for the transfer function of the path A2 5, it can be seen that this path has a low DC gain of Gmi·(rf−1/Gmo). The first pole of A2 5 is formed at the output node and is equal to Gmo/$C_L$ if Gmo·$R_L$≫1. The second pole of the same path A2 5, lies at 1/($c_{para}$·rf). Therefore, for stability, the unity gain frequency $\omega_{u2}$ of the path A2 5 in the preferred embodiment of the present invention should be smaller than the second pole:

$$(Gmi \cdot Gmo \cdot rf)/C_L < 1/[c_{para} \cdot rf]$$

This can also be expressed as:

$$[(Gmi \cdot rf)(Gmo \cdot rf) \cdot c_{para}]/C_L < 1$$

Additionally, each DC mismatch current of differential pairs of transistors ∂I/∂N·ΔN+∂I/∂(W/L)·Δ(W/L) at the Gmi stage is multiplied only by the resistance of rf 8 in the later stage to give little voltage. In this case, N is doping density, W and L represent the width and length of the particular MOSFET. Therefore the mismatch has little influence on input offset. This enables the transistor to be small in size.

Figure 3:
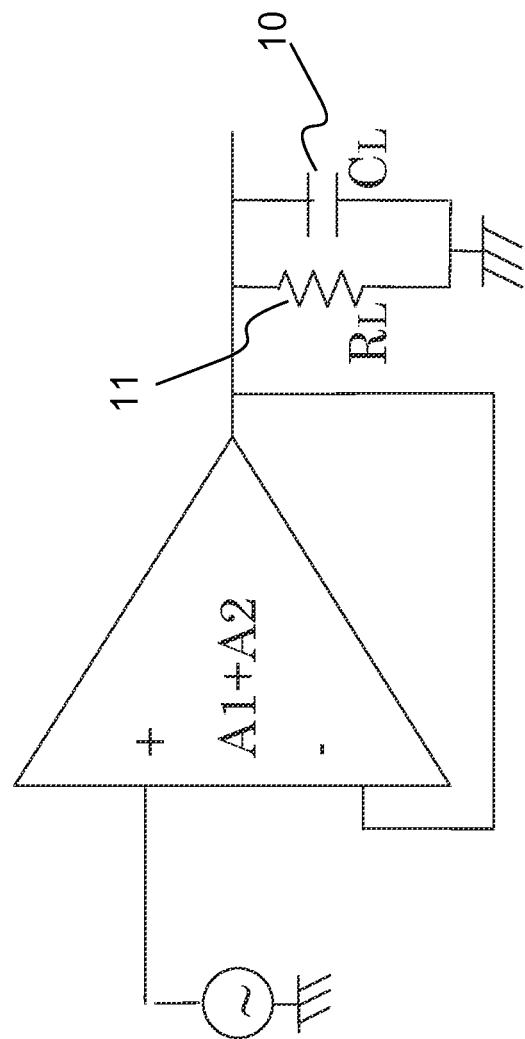
FIG. 3 is an equivalent circuit for the operational amplifier of the present invention when acting as a voltage follower.

In reference to FIG. 3 of the present invention, this is a circuit to calculate closed loop transfer function of the operational amplifier, when the present invention operates as a voltage follower. Assuming that the gain of path A1 2 is A1(s) and the gain of path A2 5 is A2(s), the transfer function for the entire operational amplifier can be calculated using the following expression:

$$V_{out}/V_{in} = [A1(s)+A2(s)]/[1+A1(s)+A2(s)]$$

In this calculation the common mode gains are ignored. Substituting:

$$A1(s) = A1/[(1+s \cdot tf)(1+s \cdot ts)]$$

Wherein (1+s·tf) represents the first pole and (1+s·ts) represent the second pole respectively.

$$A2(s) = A2/(1+s \cdot t2)$$

This results in the following equation:

$$V_{out}/V_{in} = \{A1+A2+s \cdot [A1 \cdot t2 + A2 \cdot (tf+ts)] + s^2 \cdot [A2 \cdot tf \cdot ts]\} / \{A1+A2+1+s \cdot [tf+ts+t2+A1 \cdot t2+A2(tf+ts)] + s^2 \cdot [tf \cdot ts+ts \cdot t2+t2 \cdot tf+A2 \cdot tf \cdot ts] + s^3 tf \cdot ts \cdot t2\} \approx (A1+s \cdot [A2 \cdot tf+A1 \cdot t2] + s^2 \cdot A2 \cdot tf \cdot ts) / \{A1+s \cdot [(A2+1) \cdot tf + A1 \cdot t2] + s^2 \cdot tf \cdot [(A2+1) \cdot ts+t2] + s^3 \cdot tf \cdot ts \cdot t2\}$$

When A2>>1 and A2·tf>>A1·t2
(in which the latter condition is equivalent to A2·Gmo/$C_L$>>$\omega_{u1}$ and $\omega_{u1}$ is the unity gain frequency of the path A1 2):

$$V_{out}/V_{in} \cong [(1 + s \cdot A2 \cdot tf/A1) \cdot (1 + s \cdot ts)] /$$

$$[(1 + s \cdot A2 \cdot tf/A1) \cdot (1 + s \cdot ts) \cdot (1 + s \cdot t2/A2)]$$

$$= 1/(1 + s \cdot t2/A2)$$

tf—a time constant equal to the inverse of the first pole.
ts—a time constant equal to the inverse of the second pole
The expression above, representing the transfer function of the amplifier, shows us that A2 5 should be as large as possible under condition for stability in order to get a flat curve. If this value is not much larger than 1, a drop appears. This approximately occurs close to the point ùu1/A2 due to the mismatch of position of the first pole and the first zero. Similarly, another drop step might occur due to the mismatch of the second pole and second zero.

Figure 4:
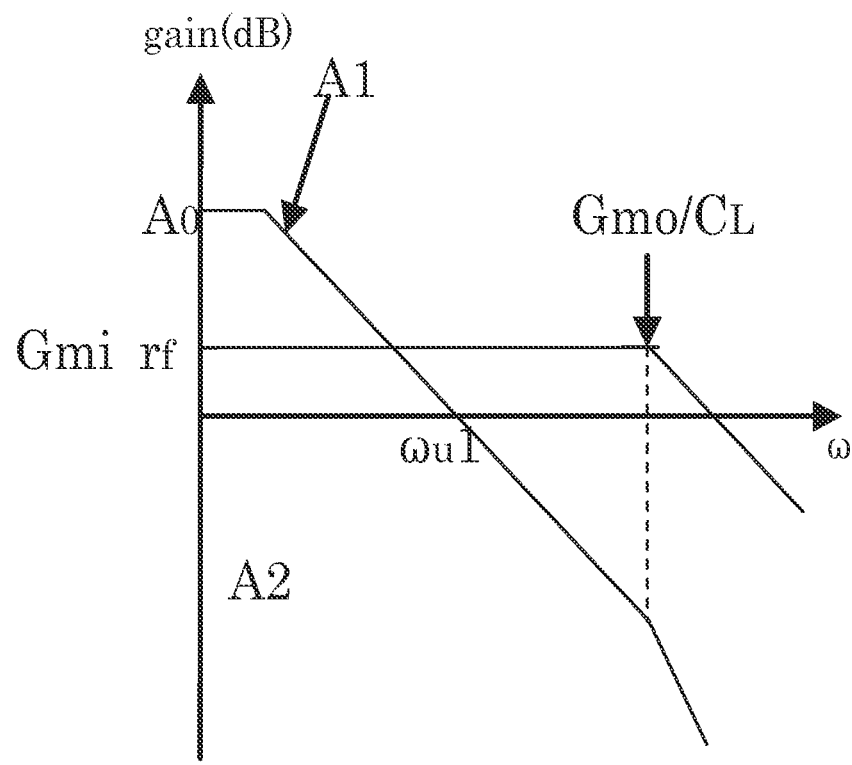
FIG. 4 is a diagram illustrating open loop characteristics for both low and high frequency paths of the present invention.
Figure 5:
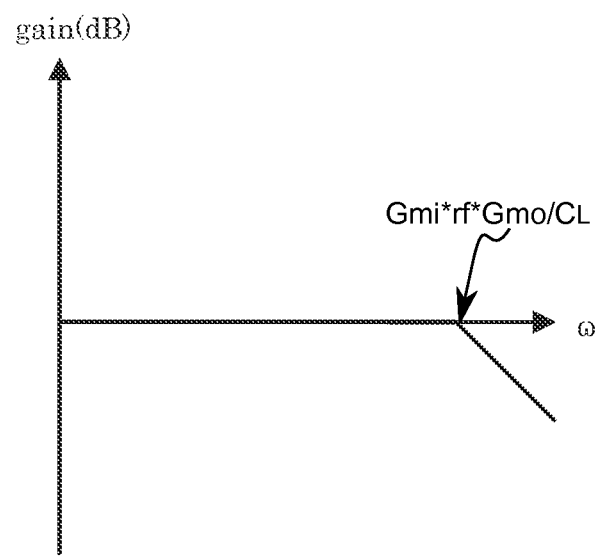
FIG. 5 illustrates closed loop characteristics for the present invention when the dual path amplifier acts as a voltage follower.

In reference to FIG. 4 and FIG. 5, these graphs illustrate characteristics of the operational amplifier. FIG. 4 illustrates the open loop characteristics for both the high frequency path A2 5 and the low frequency path A1 2 of the present invention. On the other hand, FIG. 5 illustrates closed loop characteristic of the operational amplifier of the present invention. In this instance, the dual path operational amplifier acts as a voltage follower. The closed loop transfer function was derived under the assumption that path A1 has two poles and no zero. So if the third pole exists in the range of 0 Hz to unity gain frequency of this op-amp, which is roughly Gmi*rf*Gmo/CL, the closed loop transfer function turns out to be different from that calculated. Therefore, if the third pole exists in path A1, it should be cancelled by the zero 1/(Rc·Cc) in order to get the calculated result.

Figure 6:
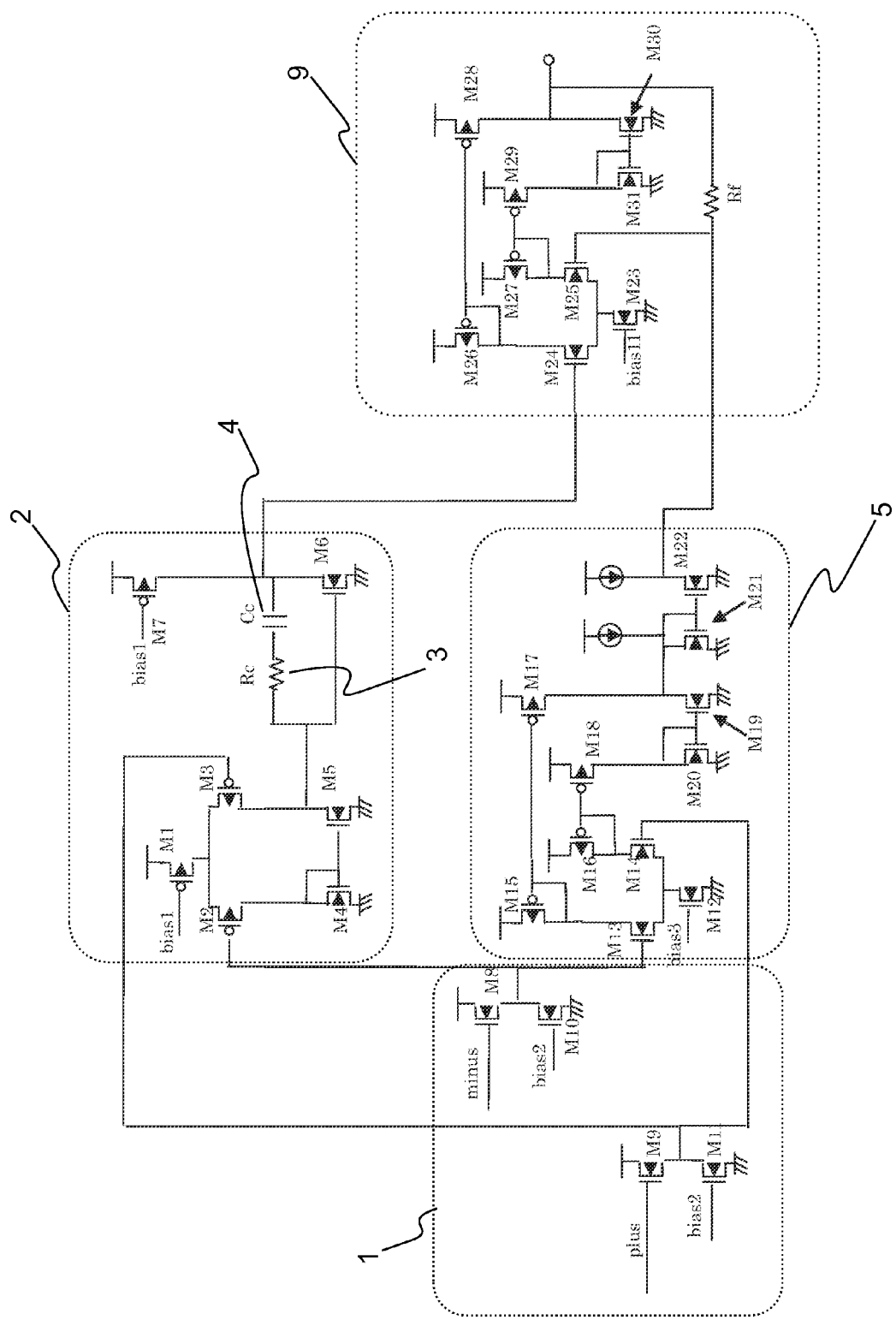
FIG. 6 illustrates an exemplary circuit implementing a dual path operational amplifier based on the present invention.

FIG. 6 represents an exemplary circuit implementing the dual path amplifier of the present invention. In the preferred embodiment of the present invention, transistors M1-M7 represent the stage amplifying an input voltage. In addition to the transistors, this section also comprises a Compensation Capacitor (Cc) 4 and a resistor (Re) 3 connected to it in series. In the preferred embodiment, the series connection of $R_c$ 3 and $C_c$ 4 are connected to the drain connection of M6 and M7. Also in the preferred embodiment of the present invention, the bias voltages are supplied to the gates of transistors M1 and M7. In this circuit diagram, the bottom centre portion represents the stage in which an input voltage is converted to an output current 5. In the preferred embodiment of the present invention, this section is represented by transistors M12-M22. The rightmost portion of the exemplary circuit corresponds to the final stage 9 of the present invention, Gmo. In the present invention, this section is represented by transistors M23-M31 and resistor Rf 8. As mentioned before this section also includes capacitor $C_L$ 10 and resistor $R_L$ 11. In the preferred embodiment the output from stage A 2 and the output from Gmi 5 are connected to the gates of transistors M24 and M25 respectively. In the circuit diagram, an additional section is provided in order to improve input impedance 1. In the preferred embodiment it is represented through transistors M8-M11. In this case tf and ts have the following values:

$$tf = gm6 \cdot (rds6 \| rds7) \cdot (rds5 \cdot rds3) \cdot Cc$$

$$ts = C_L/Gmo$$

where
Gmo=gn24·gm28/gm26. If this second pole is cancelled by a zero of 1/(Rc·Cc), ts has a different value reciprocal to a pole occurring from parasitic capacitance.

Although the current invention has been explained in reference to its preferred embodiment, it is to be understood that many other possible modifications and variations can be made without departing from the spirit and scope of the invention as in hereinafter defined by the appending claims.

What is claimed is:

1. A dual path operational amplifier, comprising
   a path for low frequency;
   a path for high frequency;
   said high frequency being higher than said low frequency;
   said dual path operational amplifier being defined into three sections, a first section, a second section and a third section;
   said first section converting a first input voltage to a first amplified output voltage;
   said third section comprising a third amplifier;
   said third amplifier comprising a plus port and a minus port;
   said first amplified output voltage being a third A input to said plus port of said third amplifier; and
   a second voltage corresponding to said second section being a third B input to said minus port of said third amplifier.

2. The dual path operational amplifier as set forth in claim 1, comprising
   a voltage follower;
   a transimpedance amplifier;
   said voltage follower being used to create said path for low frequency; and
   said transimpedance amplifier being used to create said path for high frequency.

3. The dual path operational amplifier as set forth in claim 2, comprising
   said voltage follower being a unity gain buffer; and
   a voltage gain of said unity gain buffer being unity;
   said voltage follower providing a current gain; and
   said voltage follower providing a power gain.

4. The dual path operational amplifier as set forth in claim 2, comprising
   said transimpedance amplifier converting an input voltage of said transimpedance amplifier into an output current of said transimpedance amplifier.

5. The dual path operational amplifier as set forth in claim 4, comprising
said transimpedance amplifier further comprising a feedback resistor;
said feedback resistor being defined as Rf; and
a gain of transimpedance amplifier being −Rf.

6. The dual path operational amplifier as set forth in claim 1, comprising
said second section converting a second input voltage to a second output current;
said second output current being sent to a second resistor; and
said second voltage corresponding to said second section being obtained from said second resistor.

7. The dual path operational amplifier as set forth in claim 1, comprising
said third amplifier being an current to voltage converter;
a path A connected to said plus port comprising a high direct current gain;
a path B connected to said minus port comprising a low direct current gain; and
said high direct current gain being higher than said low direct current gain.

8. The dual path operational amplifier as set forth in claim 1, comprising
said first section further comprising a load capacitor.

9. The dual path operational amplifier as set forth in claim 1, comprising
said first section further comprising a parasitic capacitor.

10. A dual path operational amplifier, comprising
a path for low frequency;
a path for high frequency;
said high frequency being higher than said low frequency;
a voltage follower;
a transimpedance amplifier;
said voltage follower being used to create said path for low frequency;
said transimpedance amplifier being used to create said path for high frequency;
said voltage follower being a unity gain buffer; and
a voltage gain of said unity gain buffer being unity;
said voltage follower providing a current gain; and
said voltage follower providing a power gain.

11. The dual path operational amplifier as set forth in claim 10, comprising
said transimpedance amplifier converting an input voltage of said transimpedance amplifier into an output current of said transimpedance amplifier;
said transimpedance amplifier further comprising a feedback resistor;
said feedback resistor being defined as Rf; and
a gain of transimpedance amplifier being −Rf.

12. The dual path operational amplifier as set forth in claim 10, comprising
said dual path operational amplifier being defined into three sections, a first section, a second section and a third section;
said first section converting a first input voltage to a first amplified output voltage;
said second section converting a second input voltage to a second output current;
said second output current being sent to a second resistor; and
a second voltage corresponding to said second section being obtained from said second resistor.

13. The dual path operational amplifier as set forth in claim 12, comprising
said third section comprising a third amplifier;
said third amplifier comprising a plus port and a minus port;
said first amplified output voltage being a third A input to said plus port of said third amplifier;
said second voltage corresponding to said second section being a third B input to said minus port of said third amplifier;
said third amplifier being an current to voltage converter;
a path A connected to said plus port comprising a high direct current gain;
a path B connected to said minus port comprising a low direct current gain; and
said high direct current gain being higher than said low direct current gain.

14. The dual path operational amplifier as set forth in claim 12, comprising
said first section further comprising a load capacitor.

15. The dual path operational amplifier as set forth in claim 12, comprising
said first section further comprising a parasitic capacitor.

16. A dual path operational amplifier, comprising
a path for low frequency;
a path for high frequency;
said high frequency being higher than said low frequency;
a voltage follower;
a transimpedance amplifier;
said voltage follower being used to create said path for low frequency;
said transimpedance amplifier being used to create said path for high frequency;
said voltage follower being a unity gain buffer; and
a voltage gain of said unity gain buffer being unity;
said voltage follower providing a current gain;
said voltage follower providing a power gain;
said transimpedance amplifier converting an input voltage of said transimpedance amplifier into an output current of said transimpedance amplifier;
said transimpedance amplifier further comprising a feedback resistor;
said feedback resistor being defined as Rf; and
a gain of transimpedance amplifier being −Rf.

17. The dual path operational amplifier as set forth in claim 16, comprising
said dual path operational amplifier being defined into three sections, a first section, a second section and a third section;
said first section converting a first input voltage to a first amplified output voltage;
said second section converting a second input voltage to a second output current;
said second output current being sent to a second resistor;
a second voltage corresponding to said second section being obtained from said second resistor;
said third section comprising a third amplifier;
said third amplifier comprising a plus port and a minus port;
said first amplified output voltage being a third A input to said plus port of said third amplifier;
said second voltage corresponding to said second section being a third B input to said minus port of said third amplifier;
said third amplifier being an current to voltage converter;
a path A connected to said plus port comprising a high direct current gain;
a path B connected to said minus port comprising a low direct current gain;

said high direct current gain being higher than said low direct current gain;
said first section further comprising a load capacitor; and
said first section further comprising a parasitic capacitor.

* * * * *